United States Patent
Wang et al.

(10) Patent No.: US 10,658,968 B2
(45) Date of Patent: May 19, 2020

(54) NEAR-FIELD BASED THERMORADIATIVE DEVICE

(71) Applicant: Mitsubishi Electric Research Laboratories, Inc., Cambridge, MA (US)

(72) Inventors: Bingnan Wang, Belmont, MA (US); Chungwei Lin, Cambridge, MA (US); Koon Hoo Teo, Lexington, MA (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 301 days.

(21) Appl. No.: 15/865,450

(22) Filed: Jan. 9, 2018

(65) Prior Publication Data
US 2018/0287548 A1 Oct. 4, 2018

Related U.S. Application Data

(60) Provisional application No. 62/477,888, filed on Mar. 28, 2017.

(51) Int. Cl.
*H02S 10/30* (2014.01)
*H01L 31/0525* (2014.01)
*H01L 31/02* (2006.01)

(52) U.S. Cl.
CPC ........ *H02S 10/30* (2014.12); *H01L 31/02021* (2013.01); *H01L 31/0525* (2013.01); *Y02E 10/50* (2013.01)

(58) Field of Classification Search
CPC .......... H02S 10/30; H02S 40/34; H02S 40/36; H01L 31/02021; H01L 31/0525
See application file for complete search history.

(56) References Cited

U.S. PATENT DOCUMENTS

| | | | |
|---|---|---|---|
| 2010/0031990 A1* | 2/2010 | Francoeur | H02S 40/44 136/206 |
| 2010/0319749 A1* | 12/2010 | Greiff | H02S 10/30 136/213 |

(Continued)

OTHER PUBLICATIONS

Strandberg, Rune. "Theoretical Efficiency Limits for Thermoradiative Energy Conversion." Journal of Applied Physics, vol. 117, No. 5, 2015, p. 055105., doi:10.1063/1.4907392. (Year: 2015).*

(Continued)

*Primary Examiner* — Eli S Mekhlin
*Assistant Examiner* — Kourtney R S Carlson
(74) *Attorney, Agent, or Firm* — Gennadiy Vinokur; James McAleenan; Hironori Tsukamoto

(57) ABSTRACT

A thermoradiative device for generating power includes a thermoradiative element having a top surface and a bottom surface, wherein the thermoradiative element is a semiconductor material having a bandgap energy $E_g$. The device includes a thermal conductive element having a first surface and a second surface, wherein the first surface is arranged to face the bottom surface of the thermoradiative element, and the first surface is a structured surface having a periodic structure, wherein the structured surface is separated from the bottom surface with a distance d to establish near-field resonance between the bottom surface and the structured surface. The device further includes supporters configured to bond the thermoradiative element and the thermal conductive element.

18 Claims, 11 Drawing Sheets

(56) References Cited

U.S. PATENT DOCUMENTS

2013/0153767 A1* 6/2013 Savoy .................. G01J 1/0429
                                                250/338.1
2018/0277699 A1* 9/2018 Lin ........................ H02S 10/30

OTHER PUBLICATIONS

Watjen et al., "Near-field radiative heat transfer between doped-Si parallel plates separated by a spacing down to 200 nm." Appl. Phys. Lett. 109, 203112 (2016); https://doi.org/10.1063/1.4967384.

* cited by examiner

US 10,658,968 B2

NEAR-FIELD BASED THERMORADIATIVE DEVICE

TECHNICAL FIELD

This invention relates to a thermoradiative (TR) device, and more specifically to a TPV energy converter in the TPV device.

BACKGROUND

Recently, thermoradiative (TR) cells have been proposed as heat engines to convert heat into electricity. The simplest form of a TR cell consists of a p-n junction that is heated to a higher temperature Tc than ambient Ta. The concept was demonstrated by experiments, although the realized efficiency was low. It is possible to boost the efficiency by designing the TR cell with nanophotonic approaches, which have been widely explored for photovoltaic (PV) and thermophotovoltaic (TPV) cells, such that selective radiation at a narrow band just above the bandgap energy is achieved. However, in this case the radiation power would be greatly suppressed. As a result, the generated power density would be extremely small.

However, with near-field resonant coupling, the radiation can go beyond the blackbody limit, and all the radiation power can be "squeezed" into a narrow bandwidth around the resonance. Based on this understanding, a heat sink was placed in close vicinity of the TR cell. It was shown that by near-field coupling of the photons generated from the TR cell to the phonon polariton mode that is supported on the surface of the heat sink (whose dispersion is described by a Lorentz model), both the conversion efficiency and the generated power density can be greatly enhanced when the resonance is very close to the bandgap energy of the TR cell. The near-field enhancement effect of TR cells was further explored, and it was shown that a metallic material, whose dispersion is described by a Drude model and supports surface plasmon polaritons (SPPs), is also good candidate for heat sink, and can have an even more significant output power density enhancement effect as compared with Lorentz type materials. The enhancement effect was understood from the impedance matching condition derived from coupled-mode theory. In the case of radiative energy transfer dominated by resonant coupling between two objects (TR cell and the heat sink, in the case of TR device), the transfer is maximized when the resonance decays into the two objects at the same rate. This condition is easier to achieve with a Drude type metallic material. An additional advantage with metals as heat sink is their typically larger thermal conductivities compared with insulators. The faster heat dissipation makes it easier to maintain a temperature close to the ambient.

To use TR cell based devices to harvest low-grade waste heat with temperature of 1000 K or lower, the preferred band gap energy of TR cell is 0.3 eV or lower. In order for the near-field resonant coupling to work, the resonant mode needs to have an energy slightly above the band gap energy of the cell. However, typical noble metals have surface plasmon resonance with much higher energy. For example, plasma frequency $\omega_p$ of gold is around 9 eV, and the frequency of SPP on planar gold surface $\omega_{SPP}=\omega_p/\sqrt{2}$ is around 6.4 eV, which is more than 20 times higher than the typical TR cell band gap energy.

The large mismatch between the bandgap frequency of the TR cell and the SPP resonant frequency of flat metal surfaces makes the TR device very inefficient. Modifications of the device design are needed to improve the power generation performance.

SUMMARY

In this invention, we design system configurations for near-field coupled TR devices to boost the near-field radiative energy transfer and electric energy generation. Thermoradiative (TR) cells are heat engines to convert heat into electricity. The simplest form of a TR cell consists of a p-n junction that is heated to a higher temperature than ambient. In this invention, we design system configurations for near-field coupled TR devices to boost the near-field radiative energy transfer and electric energy generation. A structured heat sink is coupled to the TR cell via near-field resonant coupling. Additional layers of materials are placed on the TR cell to enhance the near-field coupling to heat sink.

In some embodiments, nanostructured patterns are designed for an enhanced near-field coupled heat sink. We show that the periodic grating structures introduce additional surface resonance modes whose energies are much lower than SPP modes of the planar materials, and are much closer to the band gap energy of the TR cell, allowing for better impedance matching. Depending on the material and geometrical parameters of the grating, different resonant modes can be utilized, such as localized SPPs, waveguide modes, and spoof polaritons. With two different grating configurations, we show that different metallic materials including typical noble metals can be used as heat sink to enhance the radiative heat transfer and boost the output power density and conversion efficiency of the TR cell.

In some embodiments, the nanostructures on the heat sink surface take various geometric forms, such as spheres, cylinders, shells, and triangular shapes. In some embodiments, layered materials can be added to the front and/or back of the TR cell, in order to support additional resonant modes on the TR side. The additional resonant mode can be matched to the resonant mode supported by the heat sink. The matching of the resonant modes on the two sides enable stronger resonant coupling, which leads to enhanced radiative energy transfer and power conversion.

According to some embodiments of the present invention, a thermoradiative device for generating power includes a thermoradiative element having a top surface and a bottom surface, wherein the thermoradiative element is a semiconductor material having a bandgap energy; a thermal conductive element having a first surface and a second surface, wherein the first surface is arranged to face the bottom surface of the thermoradiative element, wherein the first surface is a structured surface having a periodic structure, wherein the structured surface is separated from the bottom surface with a distance d to establish near-field resonance between the bottom surface and the structured surface; and supporters configured to bond the thermoradiative element and the thermal conductive element.

Further, according to another embodiment of the present invention, a method for generating power includes providing a thermoradiative element having a top surface and a bottom surface, wherein the thermoradiative element is a semiconductor material having a bandgap energy; and placing a thermal conductive element having a first surface and a second surface in parallel to the thermoradiative element, wherein the first surface is arranged to face the bottom surface of the thermoradiative element, wherein the first surface is a structured surface having a periodic structure, wherein the structured surface is separated from the bottom surface with a distance d to establish near-field resonance between the bottom surface and the structured surface.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

Figure 1:
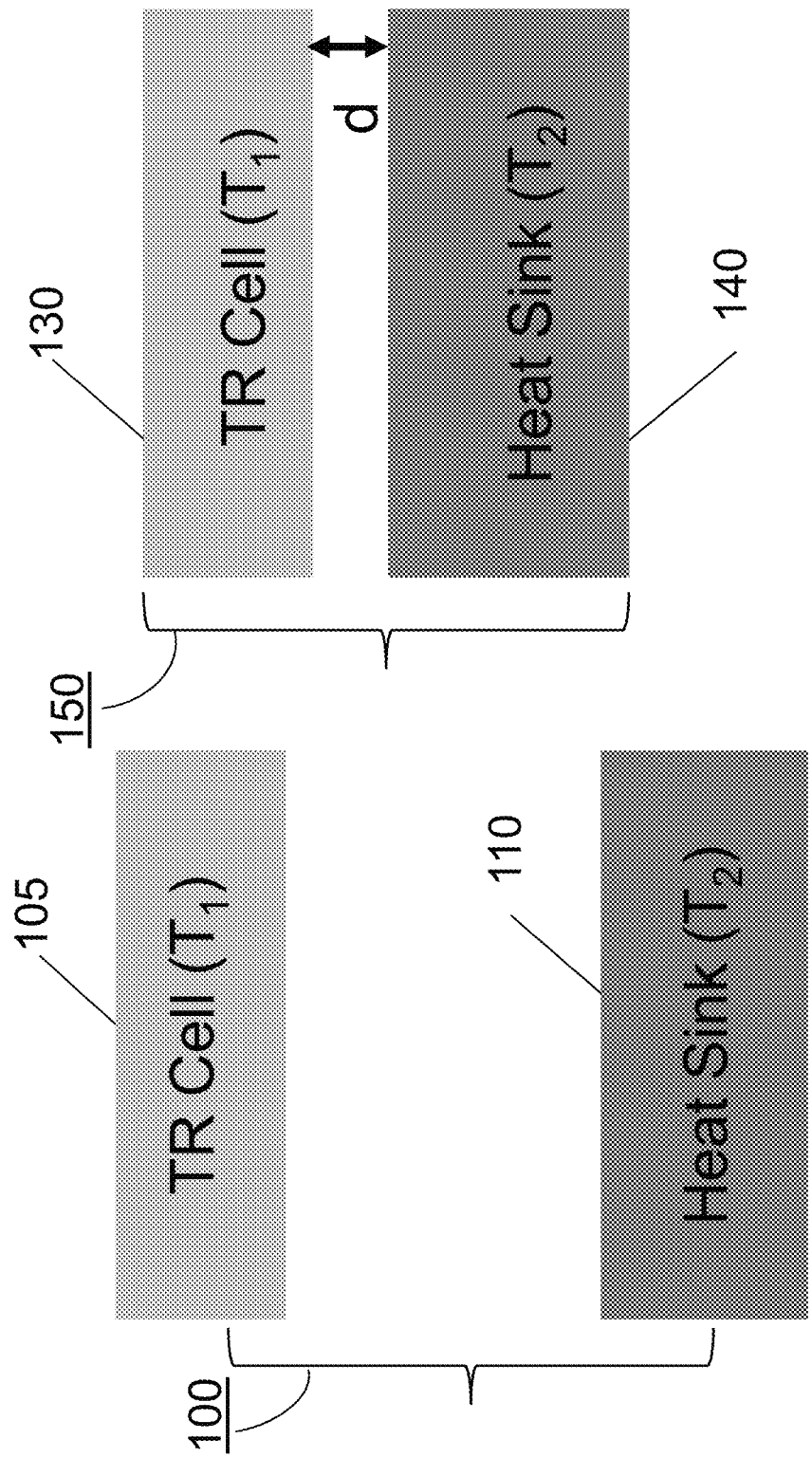
FIG. 1A shows a schematic of a TR device including a far-filed heat sink according to a related art.
FIG. 1B shows a schematic of a TR device including a flat near-field heat sink according to a related art.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process, which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

For a semiconductor diode at temperature Tc exchanging energy via radiation of photons with a thermal reservoir (either a heat source or a heat sink) at temperature Ta, the photon emission and absorption are due to transitions across the band gap and are associated with electron-hole (e-h) pair recombination and generation, respectively. When Tc=Ta, the emitted photon flux from the cell is the same as the photon flux absorbed by it, and the e-h population is in equilibrium determined by Tc, meaning no current can be generated when an external load is connected to the cell. When Tc<Ta, there will be an imbalance in photon emission and absorption, leading to a splitting of quasi-Fermi levels of electrons and holes.

In the case of TR cell, Tc>Ta, the emitted photon flux is larger than the absorbed photon flux, and the e-h population becomes smaller than the equilibrium at Tc. As a result, the cell tends to get back to the equilibrium by generating e-h pairs via all possible channels. Because of this tendency, when connected to an external load, the cell will transfer electrons in the valence band to conduction band through the load, effectively generating an electric current. In comparison, a PV cell has Tc<Ta, absorbs more photons than it emits, and accumulates more e-h pairs than the equilibrium state, therefore has a tendency to recombine the excess e-h pairs through all possible channels. When connected to an external load, the PV cell transfers electron in the conduction band to valence band through the load, effectively generating a current flow in an opposite direction as the current generated by a TR cell. For given thermodynamic parameters (temperatures Tc and Ta, and chemical potential AO, the performance of a TR device depends only on the transmissivity between the TR cell and the heat sink.

The transmissivity depends on the optical properties of materials and the geometrical parameters. When the two objects are far away, only propagating wavevector components k<ω/c contribute to the transmissivity, and the upper bound of radiation power is blackbody limit. When the distance between the two objects is smaller than the photon wavelength, evanescent wavevector components also contribute to the integrated transmissivity due to photon tunneling. Furthermore, when surface resonances are supported in the system, strong resonant coupling in the near-field can reshape the radiation spectrum, and enhance the integrated transmissivity by several orders at frequencies close to the resonances.

For a given material, the dispersion of its dielectric function, which determines the surface resonant mode, is an intrinsic property. Insulating materials with dielectric function described by a Lorentz model support surface phonon polaritons; metallic materials with dielectric function described by a Drude model support surface plasmon polaritons. In order to maximize the radiative transfer, the resonant mode needs to be close to and slightly larger than the bandgap frequency ωg. However, the surface resonant frequencies of natural materials, especially the SPP mode frequency supported by metallic materials, are often much higher than the small ωg of cells used for thermoradiative power conversion.

We show that nanostructured materials can support additional surface resonances that are closer to ωg, and, when placed close to the TR cell, can enhance the near-field coupling and the radiative transfer. Therefore, the energy conversion can be done more rapidly, and higher power density can be achieved with the same TR cell.

FIG. 1A shows the schematic of a TR cell device 100 that includes a TR cell 105 and a far-field heat sink, which means the distance of the heat sink is larger than 1 μm.

The TR cell 105 can be a semiconductor material. For example, the semiconductor material may be indium arsenide, black phosphor, or other compound semiconductors with a small bandgap energy Eg~0.3 eV. The heat sink 110 can be a metallic material such as zirconium carbide (ZrC), or Tungsten, etc.

Figure 3:
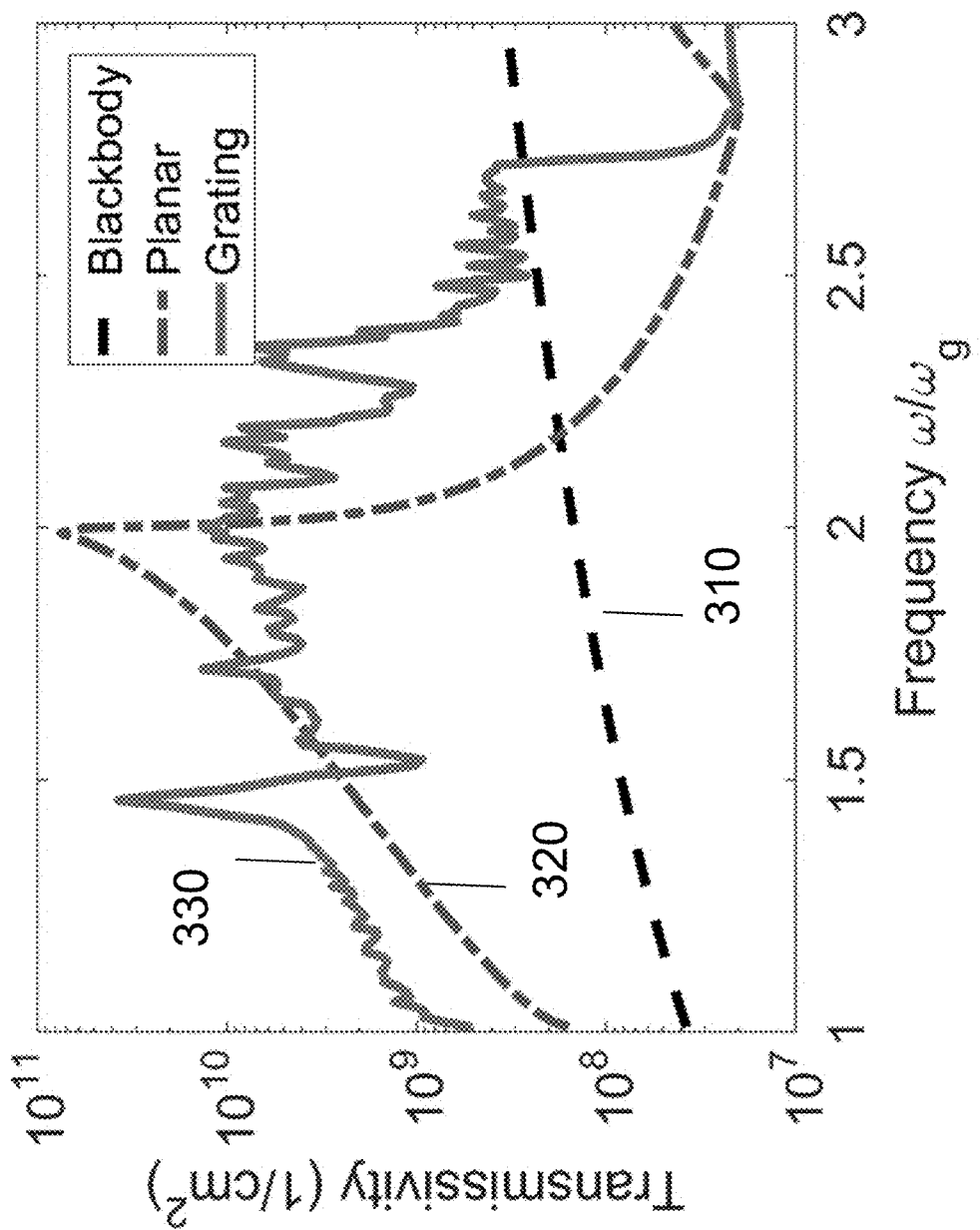
FIG. 3 shows a plot of transmissivity of a TR device according to some embodiments, indicating resonant coupling, compared with a related art.
Figure 4:
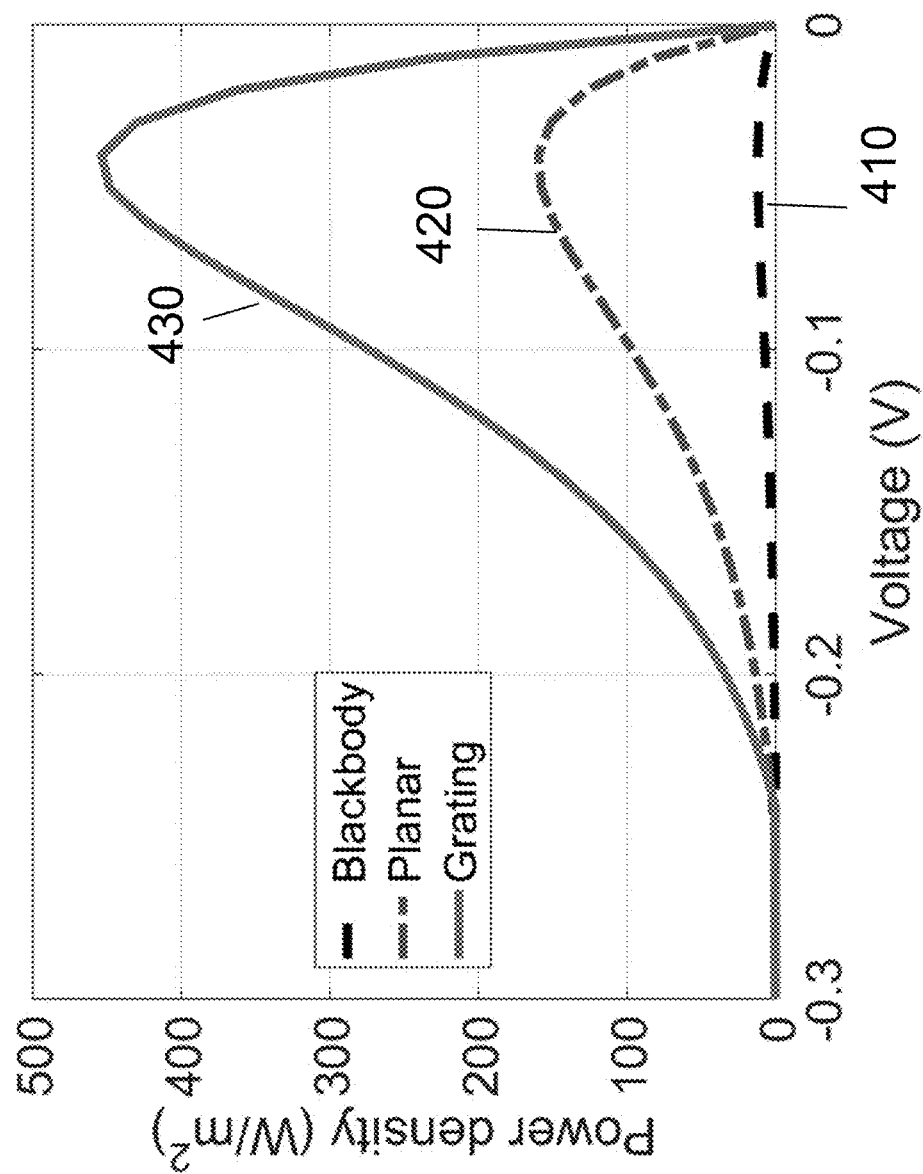
FIG. 4 shows a plot of generated electric power density according to some embodiments due to resonant coupling, compared with a related art.

Typical result of transmissivity of device 100 is shown in FIG. 3, curve 310. Typical result of output power density is shown in FIG. 4, curve 410. FIG. 1B shows the schematic of a related art TR cell (150) that includes a TR cell 130 and a flat near-field heat sink (140), according to a related art. The distance d between the TR cell and the heat sink is within the near-field range of photons, which his less than 1 μm. (Need additional descriptions to explain the device 150. Merely showing related arts does not provide any information)

The TR cell 130 can be a semiconductor material. For example, the semiconductor material may be indium arsenide (InAs), black phosphor, or other compound semiconductors with smaller bandgap around 0.3~0.4 eV. The heat sink 140 can be a metallic material such as zirconium carbide (ZrC), or Tungsten, etc.

Typical result of transmissivity of device 150 is shown in FIG. 3, curve 320. Typical result of output power density is shown in FIG. 4, curve 420.

Figure 2:
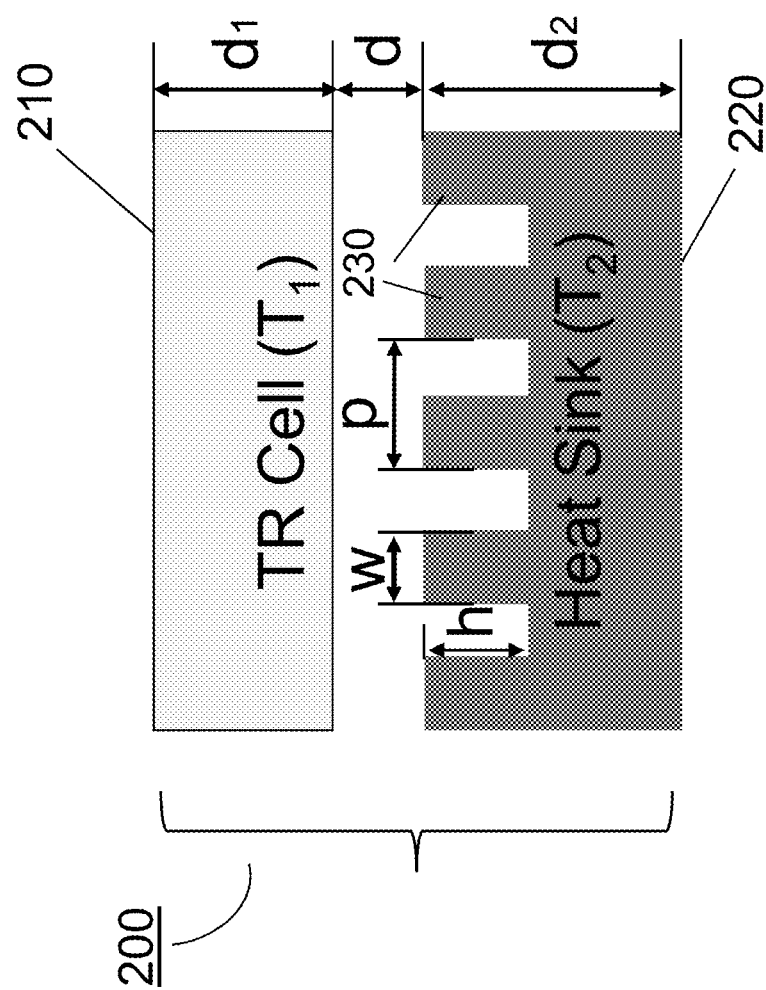
FIG. 2 shows a schematic of a TR device according to some embodiments of the present invention.

FIG. 2 shows a schematic of a TR device 200 according to some embodiments. The TR device 200 includes a TR cell 210 and a near-field heat sink 220. The TR cell 210 has a top surface and a bottom surface. The near-field heat sink 220 has a structured surface 230 referred to as a first surface and a rear surface referred to as a second surface. In this case, the structured surface is arranged to face the bottom surface of the TR cell 210. The near-field heat sink 220 is placed in parallel to and in close proximity (within predetermined distance d<1 μm) of the TR cell 210, and the heat sink 220 has a structured surface 230 facing the TR cell 210. The structured surface 230 are designed to introduce surface resonances between the bottom of the TR cell 210 and the structured surface 230 in additional to any intrinsic resonant modes supported by a planar heat sink. The TR cell 210 can be a semiconductor material having a thickness $d_1$. For example, the semiconductor material may be indium arsenic or black phosphor, or other compound semiconductors with small bandgap having Eg~0.3 eV. The thickness $d_1$ of the TR cell 210 may be in a range of 1 micron to 1000 microns.

The structured surface 230 may be a grating structure having a periodic structure such as square corrugation with height h, width w and pitch p as indicated in the figure. The thickness $d_2$ of the heat sink 220 can be 1 micron or thicker. The bottom of the TR cell 210 and the structured surface 230 of the heat sink 220 are arranged to separate by a distance d. The distance d may be from 10 nm to 500 nm. The separation can be supported using an array of silicon dioxide cylinders.

To use a TR cell based devices to harvest low-grade waste heat with temperature of 1000 K or lower, the preferred band gap energy of the TR cell is 0.3 eV or lower. In order for the near-field resonant coupling to work, the resonant mode needs to have an energy slightly above the band gap energy of the cell. However, typical noble metals have surface plasmon resonance with much higher energy. For example, plasma frequency ωp of gold is around 9 eV, and the frequency of SPP on planar gold surface ωSPP=ωp/√2 is around 6.4 eV, which is more than 20 times higher than the typical TR cell band gap energy. The large mismatch between the bandgap frequency of the TR cell and the SPP resonant frequency of flat metal surfaces makes the TR device very inefficient. Modifications of the device design are needed to improve the power generation performance.

The structured surface of the heat sink 230 introduce additional surface resonance modes whose energies are much lower than SPP modes of the planar materials, and are much closer to the band gap energy of the TR cell, allowing for better impedance matching. Therefore, more efficient power generation can be achieved.

Typical result of transmissivity of device 200 is shown in FIG. 3, curve 330. Typical result of output power density is shown in FIG. 4, curve 430.

In some cases, the TR cell may be referred to as a thermoradiative element, the near-field heat sink may be referred to as a thermal conductive element, and the structured surface may be referred to as a first surface. Further, the underneath layer of the structured surface of the near-field heat sink 220 may be referred to as a second surface. In this case, the first surface and the second surface may be made from an identical material.

FIG. 3 shows the plot of the transmissivity calculated as a function of frequency with design of the TR cell 210 having the distance d=10 nm according to one embodiment, as compared with the TR cell device 130 with the planar heat sink 140. The resonant peaks of transmissivity are seen to be closer to the bandgap frequency of the TR cells. The TR cell is modeled by the dielectric function $\epsilon_{cell}(\omega)=\epsilon_r(\omega)+i\epsilon_i(\omega)$, where $$\epsilon_i(\omega) = \begin{cases} A\sqrt{x-1}/x^2, & x > 1 \\ 0, & x < 1 \end{cases} \quad (1)$$

$$\epsilon_r(\omega) = \begin{cases} B + A(2-\sqrt{1+x})/x^2, & x > 1 \\ B + A(2-\sqrt{1+x} - \sqrt{1-x})/x^2, & x < 1 \end{cases}$$

with $$x = \frac{\hbar\omega}{E_g} \cdot E_g$$

is the bandgap of TR cell 210. The coefficients (A, B, $E_g$)=(9,10,0.3 eV) to approximation InAs semiconductor. The heat sink is modeled by the dielectric function $$\epsilon_m = 1 - \frac{\omega_p^2}{\omega^2 + i\gamma\omega} \quad (2)$$

The coefficients ($\omega_p$, $\gamma$)=(1.29×10$^{15}$, 2.58×10$^{12}$) rad/s to approximate a zirconium carbide (ZrC) metal. The curve labeled by "grating" is computed using the structure of the TR device 200 indicated in FIG. 2 with ($d_1$, $d_2$) being infinite, and (h, w, p, d)=(60, 30, 60, 10) nm.

FIG. 4 shows the plot of generated electric power density with design of the TR device 200 according to one embodiment, as compared with related art system with planar heat sink. The temperature of the TR cell 210 is at 500K, while the temperature of the heat sink is at lower 400K. The power density of the TR device 200 is 3× higher than the related art. The parameters are the same as those used in FIG. 3, which were given above.

Figure 5:
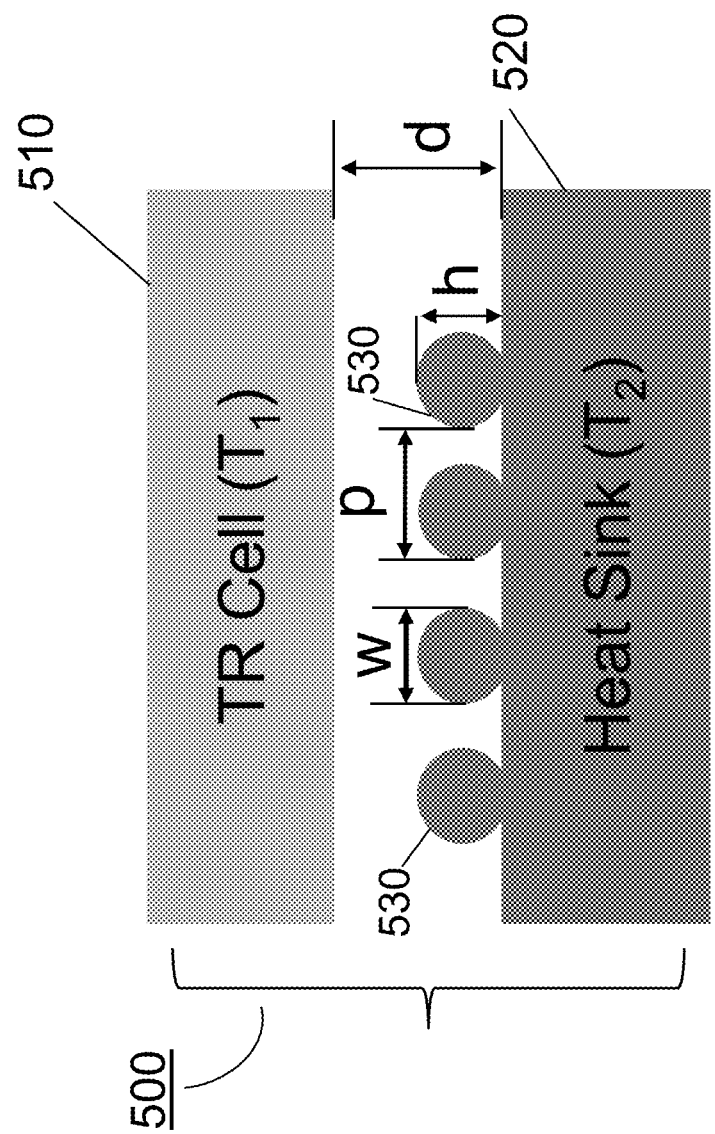
FIG. 5 shows a schematic of a TR device according to some embodiments with spherical or cylindrical structures on the heat sink.

Any geometric shapes can be utilized to create resonant modes that are close in energy to the bandgap of the TR cell. A few examples are given in FIGS. 5-7. FIG. 5 illustrates an example where the resonances are created by a grating structure having lines with cross-sectional shapes 530. The material of the grating may be the same as that of the heat sink 520. The cross-sectional shapes may be spheres 530 or ellipsoids 530. For instance, the height h, width w, pitch p and distance d may be 60 nm, 60 nm, 120 nm, and 100 nm, respectively.

Figure 6:
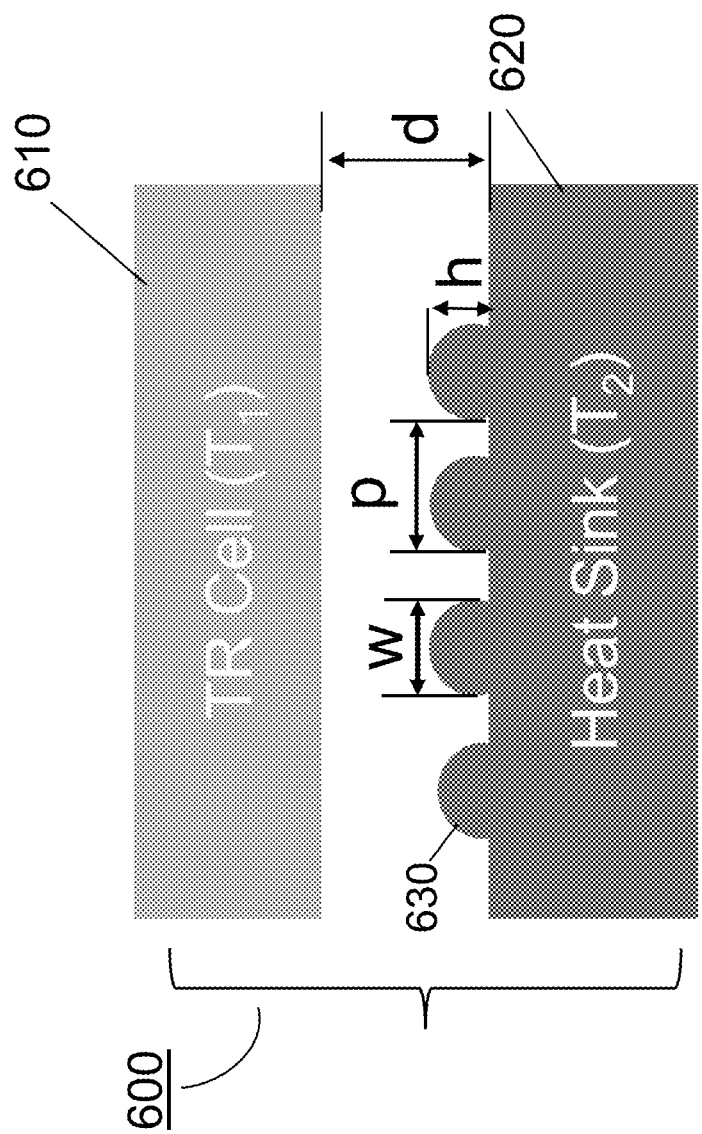
FIG. 6 shows a schematic of a TR device according to some embodiments with shell structures on the heat sink.

FIG. 6 illustrates an example where the resonances are created by a grating structure with cross-sectional shapes of hemispheres 630. The material of the grating may be the same as that of the heat sink 620. For instance, the height h, width w, pitch p and distance d may be 60 nm, 30 nm, 120 nm, 80 nm, respectively.

Figure 7:
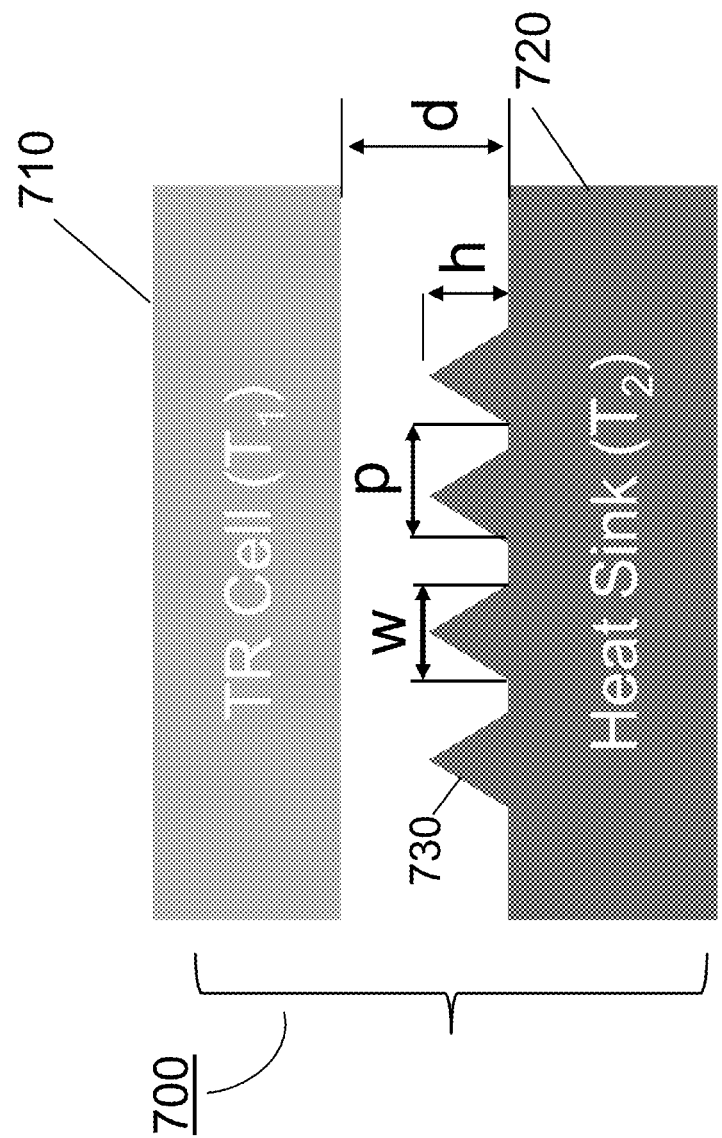
FIG. 7 shows a schematic of a TR device according to some embodiments with triangular or pyramidal structures on the heat sink.

FIG. 7 illustrates an example where the resonances are created by triangles 730. The material of the grating may be the same as that of the heat sink 720. For instance, the height h, width w, pitch p and distance d may be 60 nm, 60 nm, 120 nm, 80 nm, respectively.

Figures 8A, 8B:
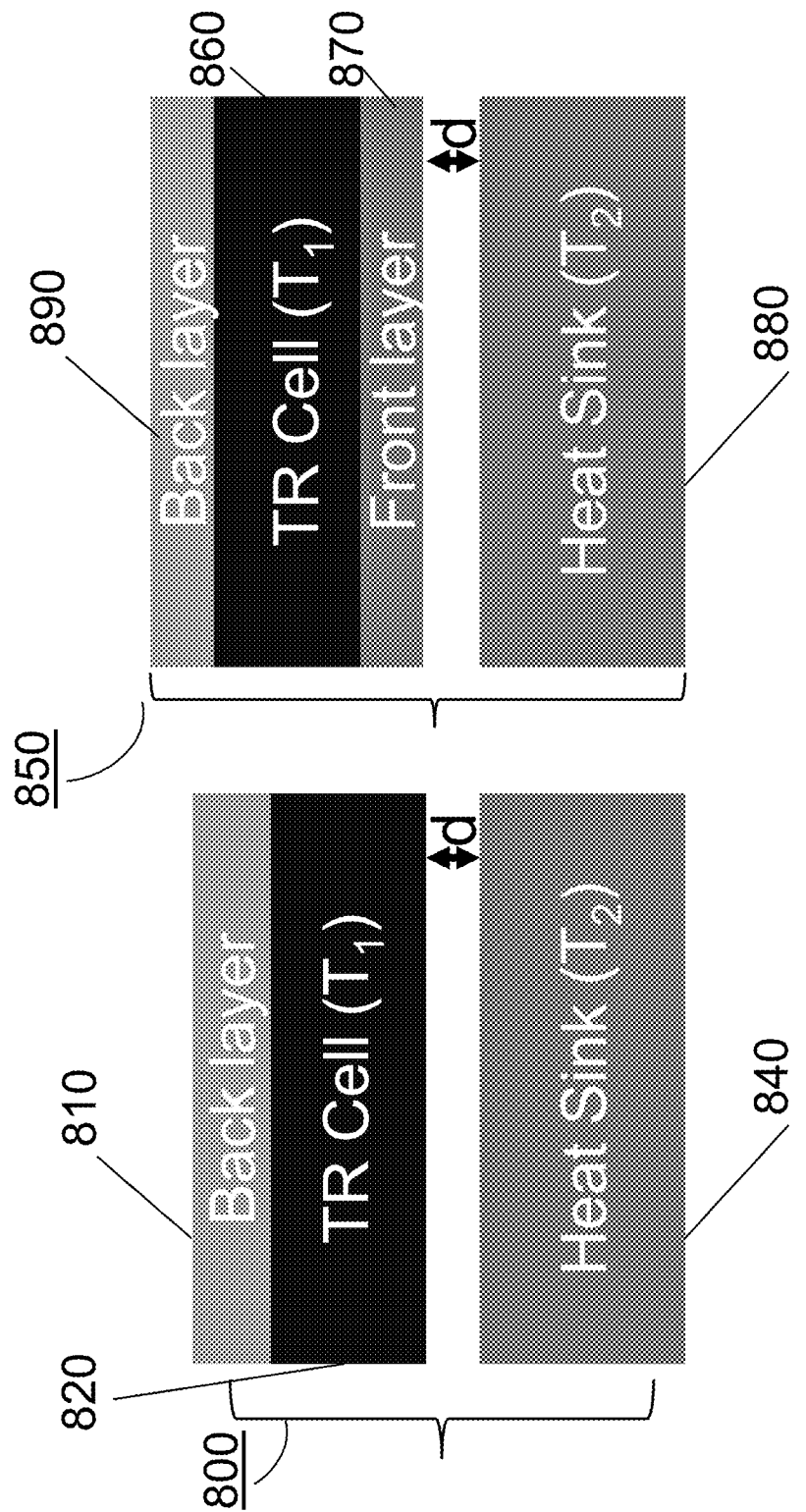
FIG. 8A and FIG. 8B shows a schematic of a TR device according to some embodiments with layered materials in front and/or back of the TR cell.

It is also desirable to have a metallic back material on the hot side. FIG. 8A illustrates an example of a TR device 800 having a back layer 810. The back layer 810, is in directly contact with a heat source (not shown), so that the high temperature of the TR cell 820 can be maintained. It also serves as reflective surface to reflect the radiation to the hot side back of the TR cell 820. The back layer 810 can be the same material as the heat sink 840, supporting the same surface resonance modes. In addition to the back layer, a front layer can be placed in front of the TR cell, directly facing the heat sink.

FIG. 8B shows another example of a TR device 850 having a front layer 870 and a back layer 890. The front layer 870 can be the same material as the heat sink 880, supporting the same surface resonance modes. In other words, a material of the front layer 870 may be identical to a material of the back layer 890. With the front and/or back layers added to the TR cells 820 and 860, resonant modes can be supported on the TR cell sides 820 and 860. Same materials as the heat sink or materials with similar dispersion relations can be used as the front and back layers, such that the resonant modes supported by the heat sink and the TR side match with each other. This enables the further enhancement of the near-field radiative energy transfer, and the generated power density. (Need candidate materials and describe why those are appropriate) Those materials may be referred to as plasmonic materials, and the plasmonic materials can be metals such as ZrC or Tungsten that supports surface plasmon resonances.

Figure 9A:
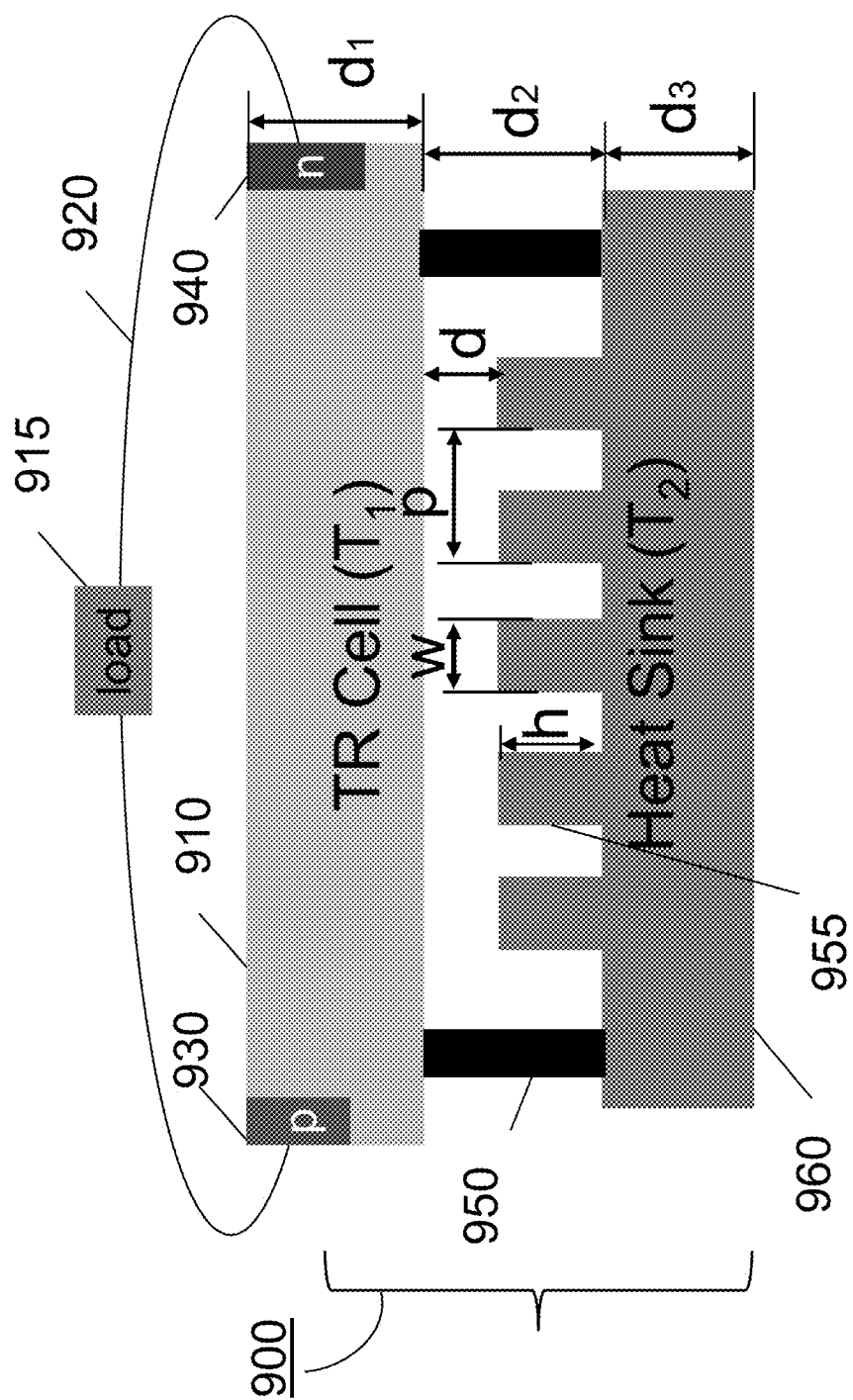
FIG. 9A shows the side view of a TR device where the heat sink has a nano-grating structure at the surface.

FIG. 9A illustrates the side view of a TR device 900. The TR device 900 includes a TR cell 910 (a semiconductor material, such as InAs) and a heat sink 960 (for example, Zirconium carbide or Tungsten) and supporters 950. The supporters 950 separate between the TR cell 910 and the heat sink 960. Both the TR cell 910 and the heat sink 960 are about 1 μm in thickness. The heat sink 960 can be thicker than 1 μm. The TR cell 910 includes a p-doped semiconductor 930 (for example, dope Indium Arsenide, InAs, with Beryllium, typically 10$^{17}$/cm$^3$) and an n-doped semiconductor 940 (for example, doped InAs by Sulfur, Silicon, typically 10$^{17}$/cm$^3$), which are embedded on opposite sides of the TR cell 910. The TR cell 910 can be grown on a substrate by the Molecular Beam Epitaxy (MBE) technique. A wire 920 with an external load 915 connects the p-doped semiconductor 930 and an n-doped semiconductor 940 via ohmic contact metal layers (not shown) for generating the electric power. The structured surface 955 of the heat sink 960 is arranged face the TR cell 910. In this case, the structured surface 955 has a grating structure having a periodic structure such as square corrugation with height h, width w and pitch p, being similar to the structured surface 230 in FIG. 2.

Figure 9B:
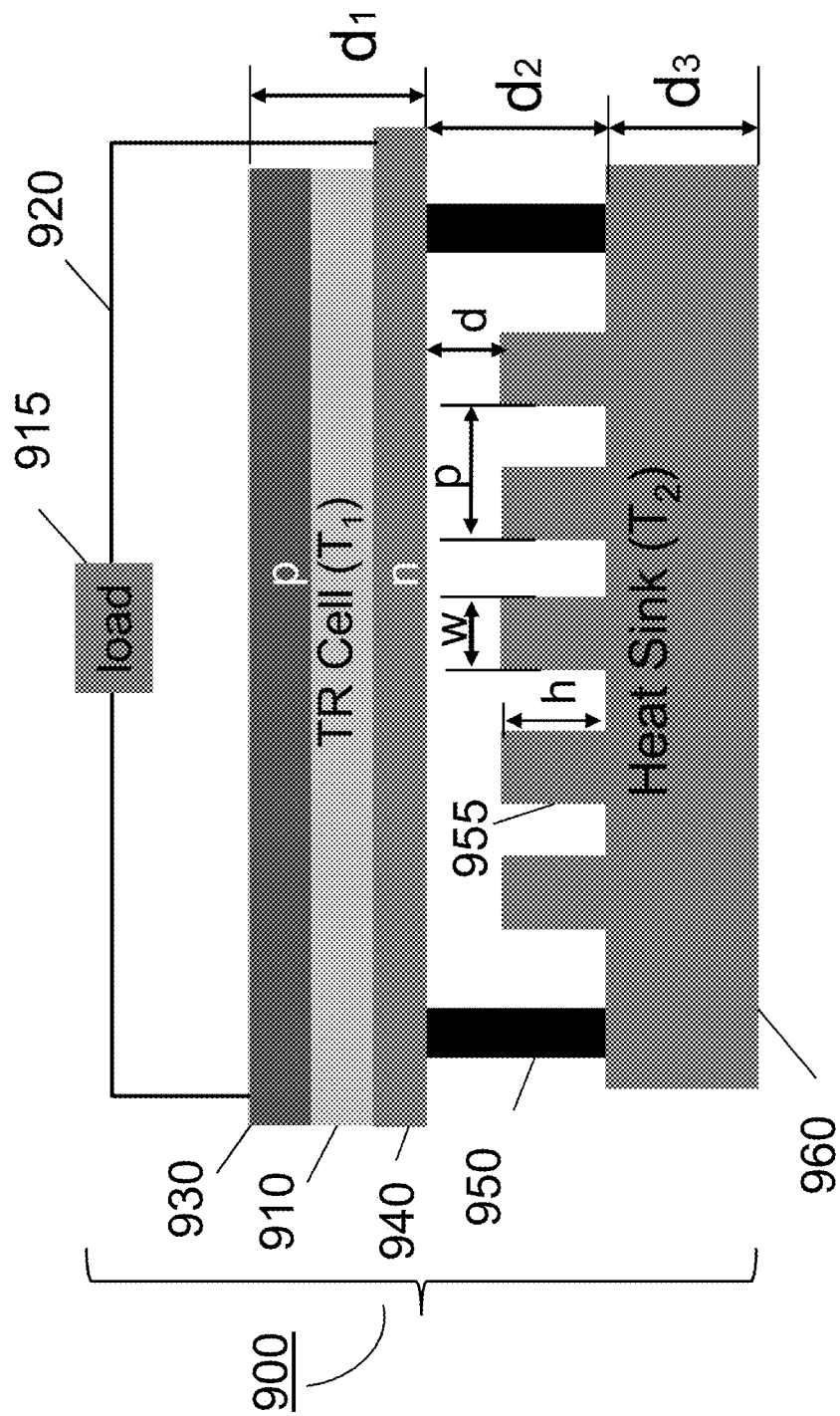
FIG. 9B illustrates a side view of another configuration of a TR device 900, according to embodiments of the present invention.

FIG. 9B illustrates a side view of another configuration of a TR device 900. In this case, identical numbers are used for the portions indicated in FIG. 9A. The TR cell 910 includes a p-doped semiconductor layer 930 and a n-doped semiconductor layer 940 sandwiching an undoped semiconductor layer Ti of the TR cell 910. The p-doped semiconductor layer 930 may be in a range from 10 nm to 500 nm, the n-doped semiconductor layer 940 may be from 10 nm to 500 nm, and the undoped semiconductor layer 910 may be from 1 μm to 500 μm. The p-doped semiconductor layer 930 is connected to one end of the wire 920 via a first ohmic metal electrode (not shown) that provides an ohmic contact to the p-doped semiconductor layer 930, and the n-doped semiconductor layer 940 is connected to another end of the wire 920 via a second ohmic metal electrode (not shown) that provides an ohmic contact to the n-doped semiconductor layer 940. For instance, the first and second ohmic metal electrodes may be formed with Ti/Pt/Au (titanium/platinum/gold) metal layers. Each of the layer thicknesses may be approximately 10~20 nm/10~15 nm/~100 nm. In this case, the Ti metal layer may be the first contact metal to the p-doped and n-doped semiconductor layers 930 and 940. Further, the metal layers may be annealed at temperatures ranging from 250 to 400° C. to form ohmic contacts to the p-type and n-type semiconductor layers 930 and 940, respectively.

In FIG. 9B, the bottom of the n-doped semiconductor layer 940 is arranged to face the structured surface of the heat sink 960, and the p-doped semiconductor layer 930 is arranged as a top surface of the TR cell 910. Further, the TR device 900 is placed in a vacuum circumstance, e.g. a vacuum tube or a vacuum chamber (not shown), while being operated.

Each of the supporters 950 can be a cylinder, with diameter of approximately 1 μm and a height in the rage of tens to hundreds of nanometers. The supporters 950 can be any materials having a high melting temperature greater than the operation temperature (e.g. T~500K) and low thermal conductance, such as silicon dioxide. The supporters 950 may be formed on the heat sink 960 by chemical vapor deposition method and lithography steps with etching processes. Further, the top of the supporters 950 and the bottom surface of the TR cell 910 can be directly bonded by a typical wafer bonding process in a commercial wafer bonder. To be more specific, the two parts, 910 and 950, can be first aligned with an alignment fixture, and placed inside a wafer bonder, and subject to a compressive force on the order of hundreds of Newton at a raised temperature, typically around 200 C, for an extended period of time, typically 60 minutes. The density of the supporters 950 on the heat sink 960 is adjusted to maintain the distance d after the bounding process.

Figure 10:
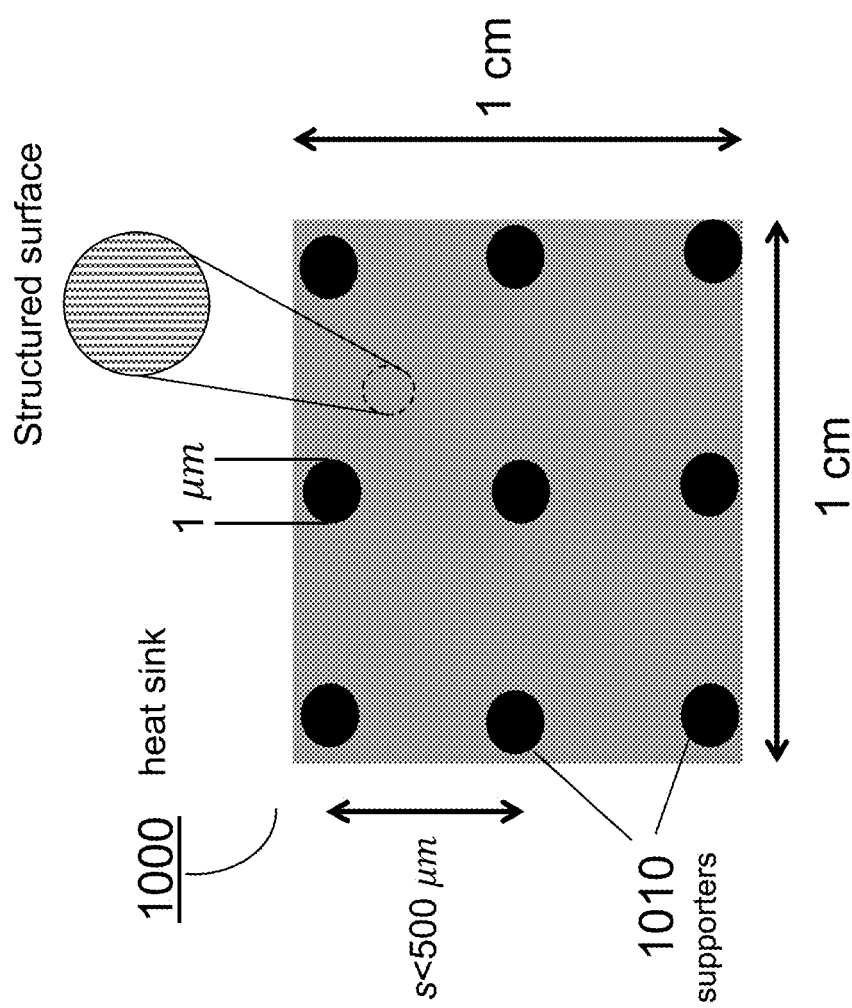
FIG. 10 shows the top view of the heat sink with an array of supporters.

FIG. 10 shows a set of supporters 1010 arranged with a typical spacing of hundreds of micrometers on the top of a heat sink 1000, including the edges and corners of the heat sink 1000. The size of the supports 1010 is not scaled. In this case, the structured surface is formed on the heat sink 1000 as indicated in the figure. The pattern of the supporters 1010 can be realized by standard technique such as photolithography and photoengraving. The nearest separations s between the supporters 1010 may be chosen so as to stably maintain the distance d between the bottom surface of the TR cell 910 and the structured surface of the heat sink 960. For instance, the separation may be equal to or less than 500 μm. In the forming process of the supporters 1010, a silicon dioxide layer and a negative photoresist layer are deposited on the surface of the heat sink 1000. The ultraviolet exposure is applied with a mask containing two-dimensional arrays of 1 μm diameter holes with a separation of hundreds of micrometers or less than hundreds of micrometers. After the development of the negative-photoresist is done, a reactive ion etching machine is then used to remove the silicon dioxide layer not protected by the photoresist. A TR cell (not shown) is then mated for bounding with the heat sink 1000 that already has the supporters. The gap of approximately 200 nm is arranged between the TR cell and the heat sink 1000.

Further, the embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments. Further, use of ordinal terms such as first, second, in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. A thermoradiative device for generating power, comprising:
a thermoradiative element having a top surface and a bottom surface, wherein the thermoradiative element is a semiconductor material having a bandgap energy;
a thermal conductive element having a first surface and a second surface, wherein the first surface is arranged to face the bottom surface of the thermoradiative element, wherein the first surface is a structured surface having a periodic structure, wherein the structured surface is separated from the bottom surface with a distance d to establish near-field resonance between the bottom surface and the structured surface; and
supporters configured to bond the thermoradiative element and the thermal conductive element.

2. The device of claim 1, wherein the first surface and the second surface are made from an identical material.

3. The device of claim 1, wherein the periodic structure is formed based on striped lines separated from each other with a pitch P, wherein each of the striped lines has a length L and a cross-sectional shape represented by a height H and a width W.

4. The device of claim 3, wherein the cross-sectional shape is rectangular having the height H and the width W.

5. The device of claim 4, wherein the thermoradiative element is made from indium arsenide (InAs), wherein the cross-sectional shape is represented by the height H=60 nm and the width W=30 nm, wherein the pitch P=60 nm and the distance d=10 nm.

6. The device of claim 1, wherein the first surface and the second surface are made from a plasmonic material.

7. The device of claim 6, wherein the plasmonic material is zirconium carbide (ZrC).

8. The device of claim 1, further comprises a first electrode and a second electrode, wherein the thermoradiative element includes a p-type layer and an n-type layer to form a p-n junction, wherein the first electrode and the second electrode are connected to the p-type layer and the n-type layer, respectively.

9. The device of claim 1, wherein the periodic structure is formed based on lines separated with a pitch P, wherein each of the lines has a length L and an approximately round shaped cross-section represented by a height H, a width W.

10. The device of claim 1, wherein the thermoradiative element includes a back layer on the top surface, wherein the back layer is directly contacted with a heat source.

11. The device of claim 1, wherein the thermoradiative element includes a front layer on the bottom surface and a back layer on the top surface, wherein the back layer is directly contacted with a heat source.

12. The device of claim 11, wherein a material of the front layer is identical to a material of the back layer.

13. The device of claim 1, wherein each of the supporters is a cylinder with a diameter of approximately 1 pm and a height in a range from ten to hundreds of nanometers, wherein the supporters are apart from each other by a distance equal to or less than 500 pm.

14. The device of claim 1, wherein a material of each of the supporters is silicon dioxide.

15. The device of claim 1, wherein the bandgap energy of the semiconductor material is approximately 0.3 eV or less than 0.3 eV.

16. The device of claim 1, wherein the structured surface has an energy of a surface resonance mode being close to the bandgap energy of the thermoradiative element for enhancing the near-field resonance.

17. A method for generating power, comprising:
providing a thermoradiative element having a top surface and a bottom surface, wherein the thermoradiative element is a semiconductor material having a bandgap energy; and placing a thermal conductive element having a first surface and a second surface in parallel to the thermoradiative element, wherein the first surface is arranged to face the bottom surface of the thermoradiative element, wherein the first surface is a structured surface having a periodic structure, wherein the structured surface is separated from the bottom surface with a distance d to establish near-field resonance between the bottom surface and the structured surface.

18. The method of claim 17, wherein the first surface and the second surface are made from an identical material.

* * * * *